United States Patent
Gross et al.

(10) Patent No.: US 6,636,111 B1
(45) Date of Patent: Oct. 21, 2003

(54) BOOTSTRAP CIRCUIT TO CANCEL INPUT BIAS CURRENTS OF A DIFFERENTIAL AMPLIFIER OVER MOST OF COMMON-MODE INPUT VOLTAGE RANGE

(75) Inventors: William H. Gross, Sunnyvale, CA (US); Danh T. Tran, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/207,446

(22) Filed: Jul. 26, 2002

(51) Int. Cl.[7] .................................................. H03L 5/00
(52) U.S. Cl. .................... 327/589; 327/307; 330/261; 330/269
(58) Field of Search ................................. 327/307, 563, 327/560, 589; 330/256, 257, 261, 288, 296

(56) References Cited

U.S. PATENT DOCUMENTS

| | | | |
|---|---|---|---|
| 4,575,685 A | 3/1986 | Dobkin et al. | 330/261 |
| 5,105,145 A * | 4/1992 | Neth | 323/316 |
| 5,517,143 A | 5/1996 | Gross | 327/108 |
| 5,627,486 A | 5/1997 | Gross | 327/108 |
| 5,812,028 A * | 9/1998 | Adachi et al. | 330/261 |
| 5,825,228 A | 10/1998 | Gross | 327/333 |
| 5,869,989 A * | 2/1999 | Furuya et al. | 327/112 |
| 6,469,578 B1 * | 10/2002 | Smith | 330/252 |

OTHER PUBLICATIONS

Linear Technology, "LT1008: Picoamp Input Current, Mircrorvolt Offset, Low Noise Op Amp," Datasheet: pp. 1–16 (1991).
Linear Technology, "LT1881/LT1882: Dual and Quad Rail–to–Rail Output, Picoamp Input Precision Op Amps," Datasheet: pp. 1–16 (2000).
Linear Technology, "LM108A/LM308A LM108/LM308: Operational Amplifiers," Datasheet: pp. 2–303 to 2–310.
Linear Technology, "LT1880: SOT–23, Rail–to–Rail Output, Picoamp Input Current Precision Op Amp," Datasheet: pp. 1–12 (2001).
Linear Technology, "LT1112/LT1114: Dual/Quad Low Power Precision, Picoamp Input Op Amps," Datasheet: pp. 1–12 (1992).

* cited by examiner

Primary Examiner—Tuan T. Lam
(74) Attorney, Agent, or Firm—Fish & Neave; Mark D. Rowland; Vinay V. Joshi

(57) ABSTRACT

An electronic circuit to cancel the input bias currents of a differential amplifier over most of the common-mode input voltage range is provided. The circuit includes an arrangement of transistors, current mirror and current sources to track the input bias currents of the differential amplifier even when the common-mode voltage is within at least 0.2 volts of the supply rail voltage level. The input bias cancellation currents are generated by tracking the input bias currents and injected into the differential amplifier inputs to cancel the input bias currents. The circuit includes a bootstrap loop to track the input bias currents when the common-mode voltage fluctuates.

21 Claims, 3 Drawing Sheets

BOOTSTRAP CIRCUIT TO CANCEL INPUT BIAS CURRENTS OF A DIFFERENTIAL AMPLIFIER OVER MOST OF COMMON-MODE INPUT VOLTAGE RANGE

BACKGROUND OF THE INVENTION

A differential amplifier is a well-known circuit containing two inputs in which the output is proportional to the instantaneous differences between the two input signals. An ideal differential amplifier is designed to amplify the differences between the two input voltages while rejecting any signal elements they have in common. The amount of voltage common to both input lines of the differential amplifier is referred to as the common-mode voltage. The remainder is referred to as the differential voltage.

The common-mode voltage generally generates a common-mode base current which includes alternating current (ac) and direct current (dc) components. The dc component is referred to as the input bias current of the differential amplifier. The input bias current is undesirable and there are several prior art techniques to cancel as big a portion of it as possible.

FIG. 1 schematically illustrates a prior art scheme for input bias current cancellation of input transistors of a differential amplifier. An arrangement 100 is shown which includes positive and negative supply rails 110 and 120 respectively, NPN transistors Q1, Q2, Q3, Q4, Q5, Q6, Q10 and Q11, PNP transistors Q7, Q8, Q9, Q12 and Q13, and current sources IS1 130 and IS2 140. The transistors Q1 and Q2 form the input stage of the differential amplifier 150. It is understood that in one embodiment, the input stage includes two PNP transistors. In such an embodiment, the transistors Q1, Q2, Q3, Q4, Q5, Q6, Q10 and Q11 include PNP transistors and the transistors Q7, Q8, Q9, Q12 and Q13 include NPN transistors.

In this description, the NPN and PNP transistors function in a manner that will be apparent to those of ordinary skill in the art. For this reason and to keep the description focused on the essence of the present invention, the design and operation of the individual transistors of the arrangement 100 are not mentioned in great detail. The NPN and PNP transistors are also referred to as the first and second conductivity type transistors respectively, or vice versa. Furthermore, the NPN and PNP transistors are also referred to as one conductivity type and opposite conductivity type transistors respectively, or vice versa.

Also, the terms rail, current source, tail current, input stage, PNP input stage, NPN input stage, base, emitter, collector, diode-connected transistor, bootstrap circuit and area of a transistor are used according to their ordinary meanings. Also, the term couple is used in its ordinary generally understood sense to mean to join two circuits, enabling signals to be transferred from one to another. The two circuits can be directly connected to each other or through an intervening element such as a third circuit. Also, the term electronic load is used in its ordinary generally understood sense to mean one or more resistors, one or more transistors, a current source coupled to one or more transistors, a current source coupled to one or more resistors, or a current source coupled to one or more resistors and one or more transistors. Finally, the terms sense and track are used in their ordinary generally understood sense to mean to detect current and to mimic the detected current respectively.

The arrangement 100 is used to cancel the input bias currents of the transistors Q1 and Q2. The transistors Q3 and Q4 are coupled to the transistors Q1 and Q2 respectively such that the base current of Q3 tracks the input bias current of Q1 and the base current of Q4 tracks the input bias current of Q2. The collector-emitter voltages (VCE) of the transistors Q1, Q2, Q3 and Q4 are the same and constant over the common mode range. Lateral transistors Q7 and Q8 are connected to the bases of the tracking transistors Q3 and Q4 respectively to current-mirror the base currents of Q3 and Q4. The mirrored currents are injected into the bases of the input transistors Q1 and Q2 to effectively cancel the input bias currents of these transistors Q1 and Q2.

The arrangement 100 can be referred to as a bootstrap circuit because the transistors Q9, Q10 and Q11 form a bootstrap loop 160. The bootstrap loop 160 is connected to the emitters of the transistors Q1, Q2, Q7 and Q8 and the bases of the transistors Q5 and Q6 such that the cancellation currents in the emitters of the transistors Q7 and Q8 will track the input bias currents of the transistors Q1 and Q2 when the common-mode input voltages fluctuate. The transistors Q10 and Q11 are diode-connected transistors.

The current source IS1 130 ensures that the current flowing from the emitters of the transistors Q1 and Q2 into the current sink (negative rail) 120 is always constant.

The current source IS2 140 ensures that the current in the loop 170 formed by the transistors Q9, Q10, Q11, Q12 and Q13 is always constant. The IS2 140 current is mirrored to the transistor Q12 through the diode-connected transistor Q13. The collector current of the transistor Q12 is used to bias the bootstrap loop 160.

A disadvantage of the above circuit 100 is that the voltage drops caused by the transistors Q12, Q8, Q4 and Q2 limit the common-mode input voltage range over which the input bias currents are cancelled to being about 1.1 VDC away from the positive supply rail 110. In other words, the above arrangement 100 does not support input bias current cancellation for rail-to-rail differential amplifiers. The following numerical example illustrates the point.

In this example, the positive supply rail 110 voltage is +5 VDC and the negative supply rail 120 voltage is 0 VDC, the current gains ($\beta$) of the NPN transistors Q1 and Q2 are 100, the input bias current before cancellation is 1 micro ampere ($\mu$A), and the diode voltage drops across the active and saturated transistors are 0.7 VDC and 0.2 VDC respectively. For circuit analysis of the arrangement 100, the transistors Q2 and Q12 are saturated and the transistors Q4 and Q8 are active.

A circuit analysis of the arrangement 100 provides the IS1 130 current at 202 $\mu$A, the voltages of 4.8 VDC and 4.1 VDC at the transistor Q8 emitter and base respectively, 3.4 VDC at the transistor Q4 emitter, 3.2 VDC at the transistor Q2 emitter and 3.9 VDC at the common-mode input. The common-mode input voltage range over which the input bias currents are cancelled is limited to being about 1.1 VDC away from the positive supply rail 110.

It is understood that in a similar example in which the differential amplifier 150 includes a PNP transistors input stage, the common-mode input voltage range over which the input bias currents are cancelled is limited to being about 1.1 VDC away from the negative supply rail. For such an example, the transistors Q1, Q2, Q3, Q4, Q5, Q6, Q10 and Q11 are PNP transistors and the transistors Q7, Q8, Q9, Q12 and Q13 are NPN transistors. Also, for such an example, the supply rail 110 is a negative supply rail and the supply rail 120 is a positive supply rail.

SUMMARY OF THE INVENTION

The present invention discloses a circuit to cancel an input bias current of a differential amplifier. In one embodiment, the circuit (200) includes an input stage (210) of the differential amplifier including first and second PNP transistors (Q21 and Q22). The collector of the first PNP transistor (Q21) is coupled to a first resistor (240), the collector of the second PNP transistor (Q22) is coupled to a second resistor (250), and the first and second resistors (210 and 250) are coupled to a negative supply rail. (230)

A tail current circuit (272) coupled to a positive supply rail (220) and the emitters of the first and second PNP transistors (Q21 and Q22) is disclosed. Also, a compensating current circuit (Q24) coupled to the tail current circuit (272) and the positive supply rail (220) is disclosed.

A third PNP transistor (Q25) is disclosed. The emitter of the third PNP transistor (Q25) is coupled to the compensating current circuit (Q24) and the collector of the third PNP transistor (Q25) is coupled to a third resistor (260) coupled to the negative supply rail (230). Also, a first diode-connected NPN transistor (Q26) is disclosed and the collector of the first diode-connected NPN transistor is coupled to the base of the third PNP transistor (Q25).

A first NPN transistor is disclosed (Q27). The base of the first NPN transistor (Q27) is coupled to the base of the first diode-connected NPN transistor (Q26), the emitter of the first NPN transistor (Q27) is coupled to the emitter of the first diode-connected NPN transistor (Q26) and the collector of the first NPN transistor (Q27) is coupled to the base of the second PNP transistor (Q22).

A second NPN transistor (Q28) is disclosed. The bases of the second and first NPN transistors (Q28 and Q27) are coupled to each other, the collector of the second NPN transistor (Q28) is coupled to the base of the first PNP transistor (Q21), and the emitters of the second and first NPN transistors (Q28 and Q27) are coupled to each other.

A bootstrap circuit (295) including third and fourth NPN transistors (Q30 and Q31), a first diode-connected PNP transistor (Q29), a second diode-connected NPN transistor (Q32) and a second current source (280) are disclosed. The emitters of the fourth NPN transistor (Q31) and the second diode-connected NPN transistor (Q32) are coupled to the negative supply rail (230), the collector of the second diode-connected NPN transistor (Q32) is coupled to the second current source (280) coupled to the positive supply rail (220), the bases of the fourth NPN transistor (Q31) and the second diode-connected NPN transistor (Q32) are coupled to each other, the collector of the fourth NPN transistor (Q31) is coupled to the collector of the first diode-connected PNP transistor (Q29), the emitters of the first diode-connected PNP transistor (Q29) and the third NPN transistor (Q30) are coupled to each other, and the collector of the third NPN transistor (Q30) is coupled to the positive supply rail (220).

The base of the third NPN transistor (Q30) is coupled to the emitters of the first and second PNP transistors (Q21 and Q22) and the tail current circuit (272), and the collector (or base) of the first diode-connected PNP transistor (Q29) is coupled to the emitters of the first and second NPN transistors (Q27 and Q28) and the emitter of the first diode-connected NPN transistor (Q26).

The tail current circuit (272) generates a bias current for the first and second PNP transistors (Q21 and Q22). The compensating current circuit (Q24) provides a current equal to the bias current to the third PNP transistor (Q25). The third PNP transistor (Q25) supplies the first diode-connected NPN transistor (Q26) with an input bias cancellation current. The first and second NPN transistors (Q27 and Q28) supply the bases of the second and first PNP transistors (Q22 and Q21) with the input bias cancellation current respectively. The bootstrap circuit (295) adjusts the input bias cancellation current responsive to a common mode voltage fluctuation. The circuit (200) can cancel the input bias current for common-mode voltages ranging up to within 0.2 volts (VDC) of the negative rail (230) voltage.

In another embodiment, the input stage (210A) of the differential amplifier includes two NPN transistors (Q21A and Q22A). In this embodiment, the integrated circuit (200A) can cancel the input bias current for common-mode voltages ranging up to within 0.2 volts (VDC) of the positive rail (220) voltage.

DETAILED DESCRIPTION OF THE INVENTION

Figure 2:
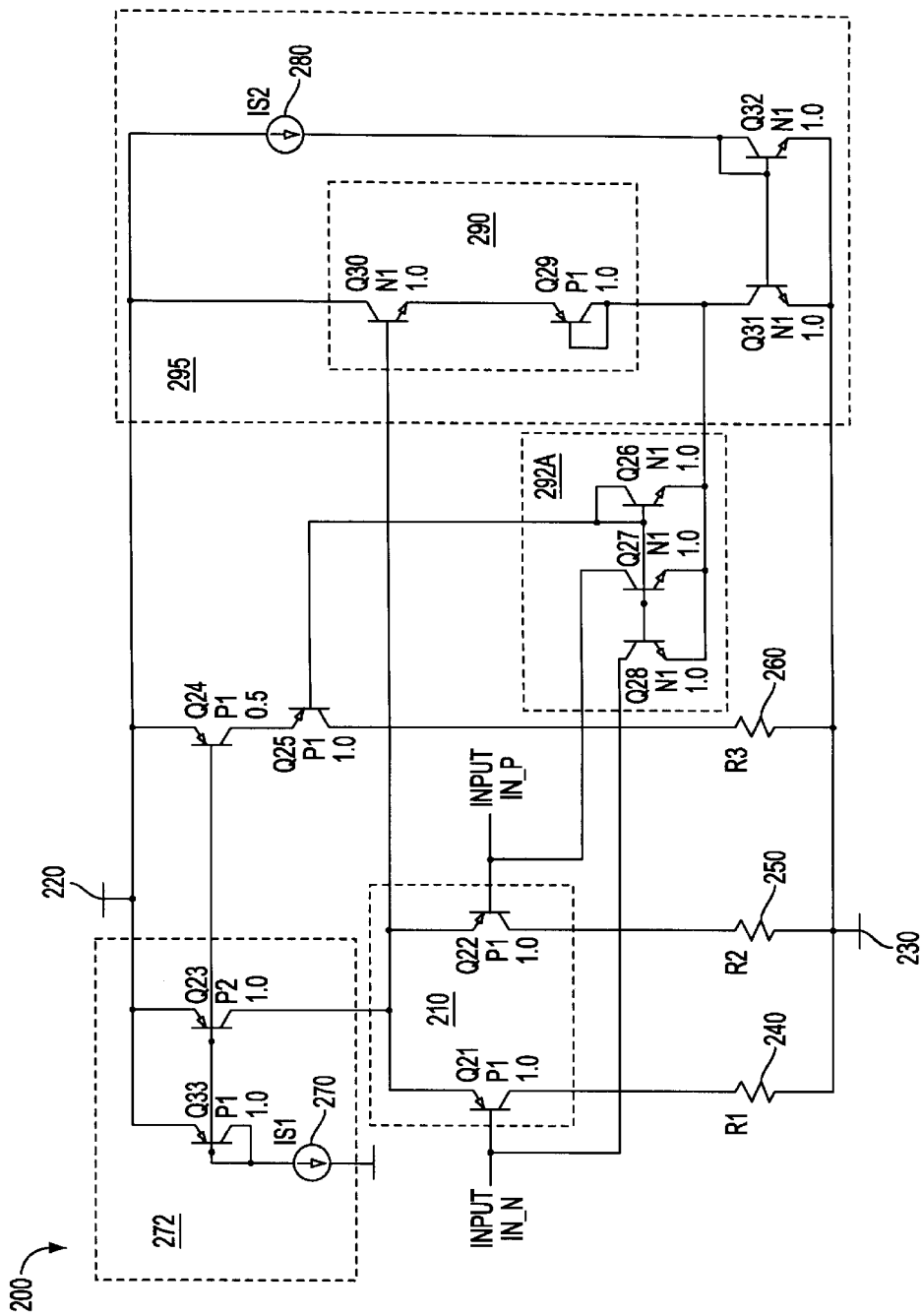
FIG. 2 schematically illustrates one embodiment of an arrangement of the present invention for canceling the input bias currents of a bipolar transistor differential pair having a PNP input stage.

FIG. 2 schematically illustrates one embodiment of an arrangement 200 of the present invention for canceling the input bias currents of a bipolar transistor differential pair having a PNP input stage 210 over most of the common-mode input voltage range. The arrangement can be implemented as an integrated circuit (IC). The arrangement 200 is effective up to very close to a negative supply rail 230 voltage. The input bias currents can range from pico amperes (pA) to micro amperes ($\mu$A).

The arrangement 200 includes the input stage 210, positive and negative supply rails 220 and 230 respectively, PNP transistors Q21, Q22, Q23, Q24, Q25, Q29 and Q33, NPN transistors Q26, Q27, Q28, Q30, Q31 and Q32, resistors R1 240, R2 250 and R3 260, and current sources IS1 270 and IS2 280. The PNP transistors Q21 and Q22, whose emitters are coupled to each other, form the PNP input stage 210 of the differential amplifier 210. The transistors Q21 and Q22 are referred to as the differential input transistors Q21 and Q22.

Figure 1:
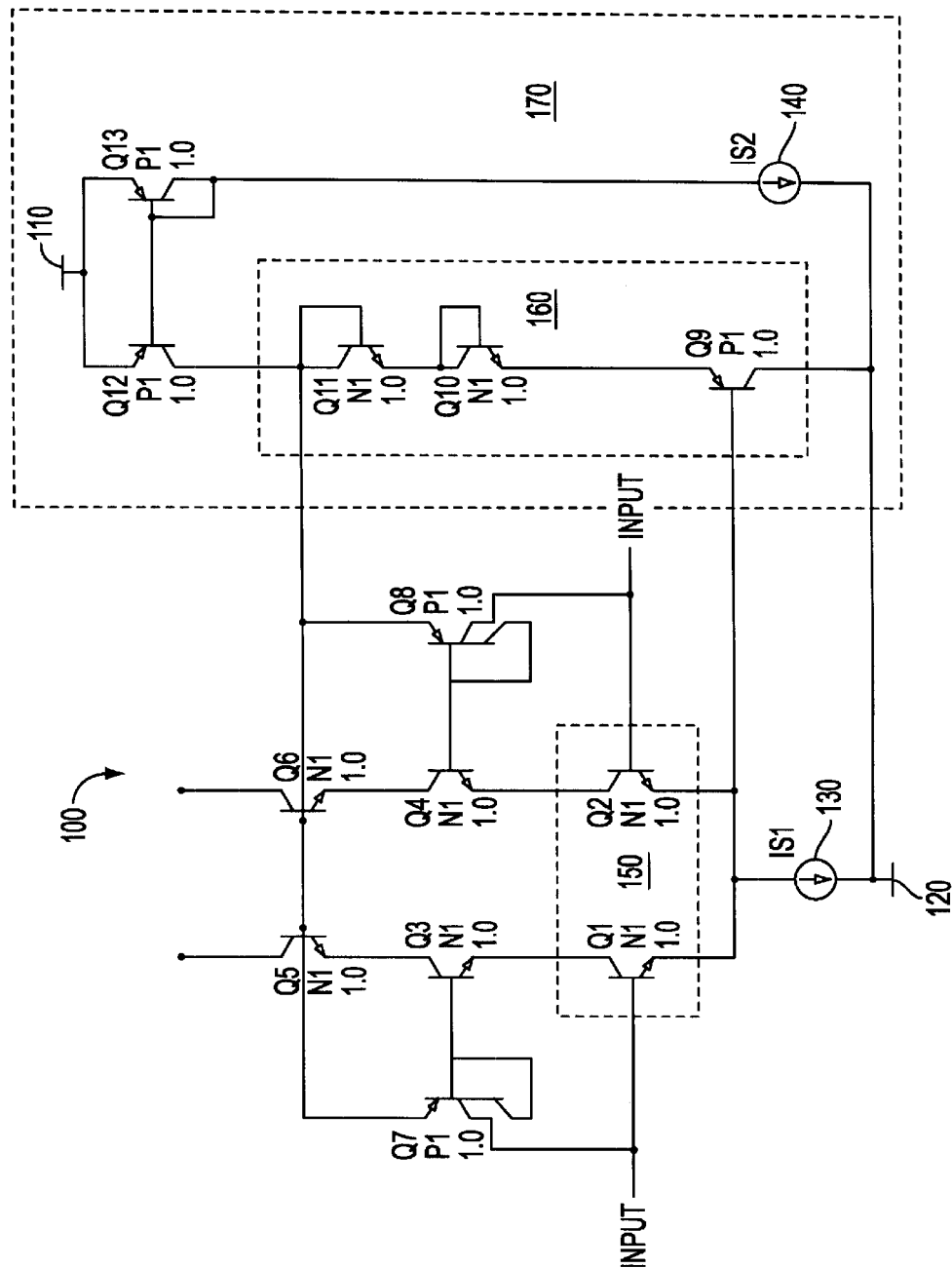
FIG. 1 schematically illustrates a prior art scheme for input bias current cancellation of input transistors of a differential amplifier.

The arrangement 200 is embodied in the Model Number LT1800 rail-to-rail input output operational amplifier designed and built by the Linear Technology Corporation located in Milpitas, Calif. The Linear Technology Corporation is the assignee of the present application. It will be evident that the present arrangement is also applicable to non rail-to-rail operational amplifiers such as the differential amplifier illustrated in FIG. 1.

In one embodiment, the positive supply 220 rail voltage is +5 VDC and the negative supply rail 230 voltage is –5 VDC. In another embodiment, the positive supply rail 220 voltage is +5 VDC and the negative supply rail 230 voltage is 0 VDC. In yet another embodiment, the positive supply rail 220 voltage is +3 VDC and the negative supply rail 230 voltage is 0 VDC. In still other embodiments, the positive supply rail 220 voltages can range from +2 VDC to +18 VDC and the negative supply rail 230 voltages range from –2 VDC to –18 VDC.

The collector of the transistor Q23 is coupled to the emitters of the transistors Q21 and Q22. The emitter of the transistor Q23 is coupled to the positive supply rail 220 and the base of the transistor Q23 is coupled to the base of the diode-connected transistor Q33. The emitter of the diode-connected transistor Q33 is coupled to the positive supply rail 220 and the base of the diode-connected transistor Q33 is coupled to the current source IS1 270. The current source IS1 270 is coupled to the negative rail 230. The transistor Q23, the diode-connected transistor Q33 and the current source IS1 270 form the tail current circuit 272 because they set up the bias current of the transistors Q21 and Q22. The collector of the transistor Q21 is coupled to the resistor R1 240 and the resistor R1 240 is coupled to the negative rail 230. The collector of the transistor Q22 is coupled to the resistor R2 250 and the resistor R2 250 is coupled to the negative rail 230. It will be understood by those of ordinary skill in the art that the resistors R1 240 and R2 250 are exemplary electronic loads and can be replaced by other electronic loads such as current sources coupled to transistors.

The base of the transistor Q24 is coupled to the base of the transistor Q23, the emitter of the transistor Q24 is coupled to the positive supply rail 220 and the collector of the transistor Q24 is coupled to the emitter of the transistor Q25. The base of the transistor Q25 is coupled to the base of the diode-connected transistor Q26. The collector of the transistor Q25 is coupled to the resistor R3 260, and the resistor R3 260 is coupled to the negative rail 230. It will be understood by those of ordinary skill in the art that the resistor R3 260 is an exemplary electronic load and can be replaced by other electronic loads such as a current source coupled to a transistor. Those of ordinary skill in the art will also appreciate that the arrangement 200 can operate properly without the resistor R3 260 or an equivalent electronic load.

The transistor Q24 is an exemplary compensating current circuit which can amplify, mimic (track) in entirety or mimic a portion of the transistor Q23 collector current. The ratio of the areas of the transistors Q23 and Q24 determine the portion of the transistor Q23 collector current that is tracked by the transistor Q24.

In the preferred embodiment, the ratio between the areas of the transistors Q23 and Q24 is one to one-half (1:½). In other words, the emitter area of the transistor Q24 is one half of the emitter area of the transistor Q23. In the preferred embodiment, the transistor Q24 mimics one-half of the transistor Q23 collector current. In another embodiment, the ratio of the areas is one to one (1:1). In the preferred embodiment, the emitter area of the transistor Q28 equals the emitter area of the transistor Q27, the emitter area of the transistor Q24 is a constant "x" times the emitter area of the transistor Q23 and the emitter area of the transistor Q26 is two times "x" times the emitter area of the transistor Q27. The transistors Q21, Q22 and Q25 should have the same current density.

The preferred embodiment requires a one to one-half ratio because the transistor Q23 collector current, which is also referred to as the tail current, is equal to the sum of the identical emitter currents of the transistors Q21 and Q22. Thus, the one to one-half ratio allows the transistor Q24 to duplicate the emitter current of either transistor Q21 and Q22. It is understood that the emitter current of either transistor Q21 and Q22 is the input bias current multiplied by the current gain ($\beta$+1) of either transistor Q21 and Q22. The transistor Q24 collector current, which is also referred to as the transistor Q24 output current, is used to drive the transistor Q25.

The collector-emitter voltage (VCE) of Q24 must be the same as the VCE of the transistor Q23 for the transistor Q24 output current to be one-half the tail current set up by the transistor Q23. To accomplish this, the transistor Q30 senses the voltage at the transistor Q23 collector. The base of the transistor Q30 is coupled to the collector of the transistor Q23. The collector of the transistor Q30 is coupled to the positive supply rail 220. The emitter of the transistor Q30 is coupled to the emitter of the diode-connected transistor Q29. The two diode voltage drops caused by the transistor Q30 and the diode-connected transistor Q29 set the transistor Q29 collector voltage at the transistor Q23 collector voltage minus two diode voltage drops.

The voltage at the collector of the diode-connected transistor Q26 is one diode voltage higher than the transistor Q29 collector voltage. The voltage at the emitter of the transistor Q25 is one diode voltage higher than the voltage at the collector of the transistor Q26. The transistor Q25 emitter voltage is thus the same as the collector voltage of the transistor Q23. The emitter voltage of the transistor Q25 is the same as the collector voltage of the transistor Q24 because the transistor Q25 emitter and the transistor Q24 collector are connected together.

The emitter voltages of the transistors Q21 and Q22 are the same as the collector voltage of the transistor Q23 because the emitters of the transistors Q21 and Q22 are connected to the collector of the transistor Q23. Because of that and because the collector voltage of the transistor Q24 is the same as the collector voltage of the transistor Q23, the emitter voltages of the transistors Q21 and Q22 are the same as the emitter voltage of the transistor Q25. For the transistor Q25 to mimic the base current of the transistors Q21 and Q22, the collector voltage of the transistor Q25 must be the same as the collector voltages of the transistors Q21 and Q22. To accomplish this, the values of the resistors R1 240, R2 250 and R3 260 are selected to be the same. For example, the resistors R1 240, R2 250 and R3 260 can be 800 ohms resistors.

Because the transistor Q25 mimics the base current of the transistors Q21 and Q22, the base current of the transistor Q25 is the same as the input bias current of the transistors Q21 and Q22. The base of the transistor Q25 is connected the diode-connected transistor Q26 to mirror the base current of the transistor Q25 to the transistors Q27 and Q28. The emitters of the transistors Q27 and Q28 are coupled to the collector of the transistor Q29. The collector of the transistor Q28 is coupled to the base of the transistor Q21 and the collector of the transistor Q27 is coupled to the base of the transistor Q22. The mirrored currents of the transistors Q27 and Q28 are injected into the bases of the transistors Q22 and Q21, respectively, to cancel the input bias currents of the transistors Q22 and Q21. The diode-connected transistor Q26 and the transistors Q27 and Q28 thus collectively form a current mirror 292. The diode-connected transistor Q26 forms the input portion of the current mirror 290 because it receives the input bias current from the base of the transistor Q25. The transistors Q27 and Q28 form the output portion of the current mirror 292 because they (Q27 and Q28) supply the input bias current to the transistors Q22 and Q21 respectively.

The fluctuations in the common-mode voltages of the transistors Q21 and Q22 cause the collector-emitter voltages (VCE) of the transistors Q21, Q22 and Q23 to vary, which, in turn, affect the collector and base currents of those transistors Q21, Q22 and Q23 due to the transistors Q21, Q22 and Q23 output resistances and betas. To minimize the effects of the common-mode voltage fluctuations, a bootstrap loop 290, including the transistors Q29 and Q30 is used in which the base of the transistor Q30 is connected to the emitters of the transistors Q21 and Q22 and the collector of the transistor Q23, and the collector of the diode-connected transistor Q29 is connected to the emitters of the transistors Q26, Q27 and Q28. The current source IS2 280 maintains a constant current in the bootstrap circuit 295 formed by the transistors Q32, Q31, Q29 and Q30. The current source IS2 280 current is mirrored to the transistor Q31 through the diode-connected transistor Q32. The bootstrap circuit 295 facilitates the accurate tracking of the base current of the transistor Q25 that is mirrored through the transistors Q26, Q27 and Q28 during the common-mode voltages fluctuation, so that the input bias currents of the transistors Q21 and Q22 can be effectively cancelled.

When the common-mode voltage is within 0.9 VDC of the negative supply rail 230 voltage, the transistors Q29 and Q30 are gradually switched off. However, the transistor Q31 supports the base current of the transistor Q25 through the collector current of the transistor Q26. The transistor Q31 also supports the input bias cancellation currents for the transistors Q21 and Q22 through the collector currents of the transistors Q28 and Q27, respectively. As is shown in the numerical example below, for the common-mode voltage range from within 0.4 VDC to 0 VDC of the negative supply rail 230 voltage, the collector currents of the transistors Q27 and Q28 gradually decay until the transistors Q27 and Q28 switch off. The transistors Q27 and Q28 generally switch off when their collector voltages equal or exceed their emitter voltages. Because the collector currents of the transistors Q27 and Q28 are the input bias cancellation currents, there is a progressive decline in the portion of the input bias current which is cancelled as the common-mode voltage approaches from within 0.4 VDC to 0 VDC of the negative supply rail 230 voltage.

The voltage and current analysis of the preferred embodiment of the arrangement 200 can be illustrated through a numerical example. In this example, the positive and negative supply rail 220 and 230 voltages are +5 VDC and 0 VDC respectively, the input bias current before cancellation is 1 $\mu$A, the $\beta$ of the PNP transistors Q21 and Q22 is 100, and the collector-emitter voltage (VCE) across saturated and active transistors are 0.2 VDC and 0.7 VDC respectively. During operation of the arrangement 200, bias current cancellation takes place even with the transistor Q31 saturated and works well until the transistors Q27 and Q28 saturate.

A voltage analysis of the arrangement 200, at the point of loss of bias current cancellation, provides that the transistor Q31 collector voltage is one collector-emitter saturated voltage drop above the negative supply rail 230 voltage at +0.2 VDC and the common-mode input voltage is two collector-emitter saturated voltages above the negative supply rail 230 voltage at +0.4 VDC. Thus, in the preferred embodiment of the arrangement 200, the input bias current can be cancelled over a common-mode input voltage range of voltages at least to within 0.4 VDC of the negative supply rail 230 voltage. The emitter voltages of the transistors Q26, Q27 and Q28 are +0.2 VDC because the emitters of the transistors Q26, Q27 and Q28 are coupled to the collector of the transistor Q31.

One of ordinary skill in the art will appreciate that the transistors Q26 and Q27 will generate progressively less input bias cancellation current as the common-mode voltage declines from within 0.4 VDC to 0.2 VDC above the negative supply rail 230 voltage. Therefore, at least some of the input bias current can be cancelled as the common-mode input voltage approaches to within 0.2 VDC of the negative supply rail 230 voltage.

A current analysis of the preferred embodiment of the arrangement 200 provides that because the $\beta$ is 100, the emitter and base currents of the transistors Q21 and Q22 are 101 $\mu$A and 1 $\mu$A respectively. Accordingly, the tail current is 202 $\mu$A, the transistor Q24 collector current is 101 $\mu$A, the transistor Q25 base and collector currents are 1 $\mu$A and 100 $\mu$A respectively, and the transistors Q27 and Q28 each has a collector current of 1 $\mu$A.

Figure 3:
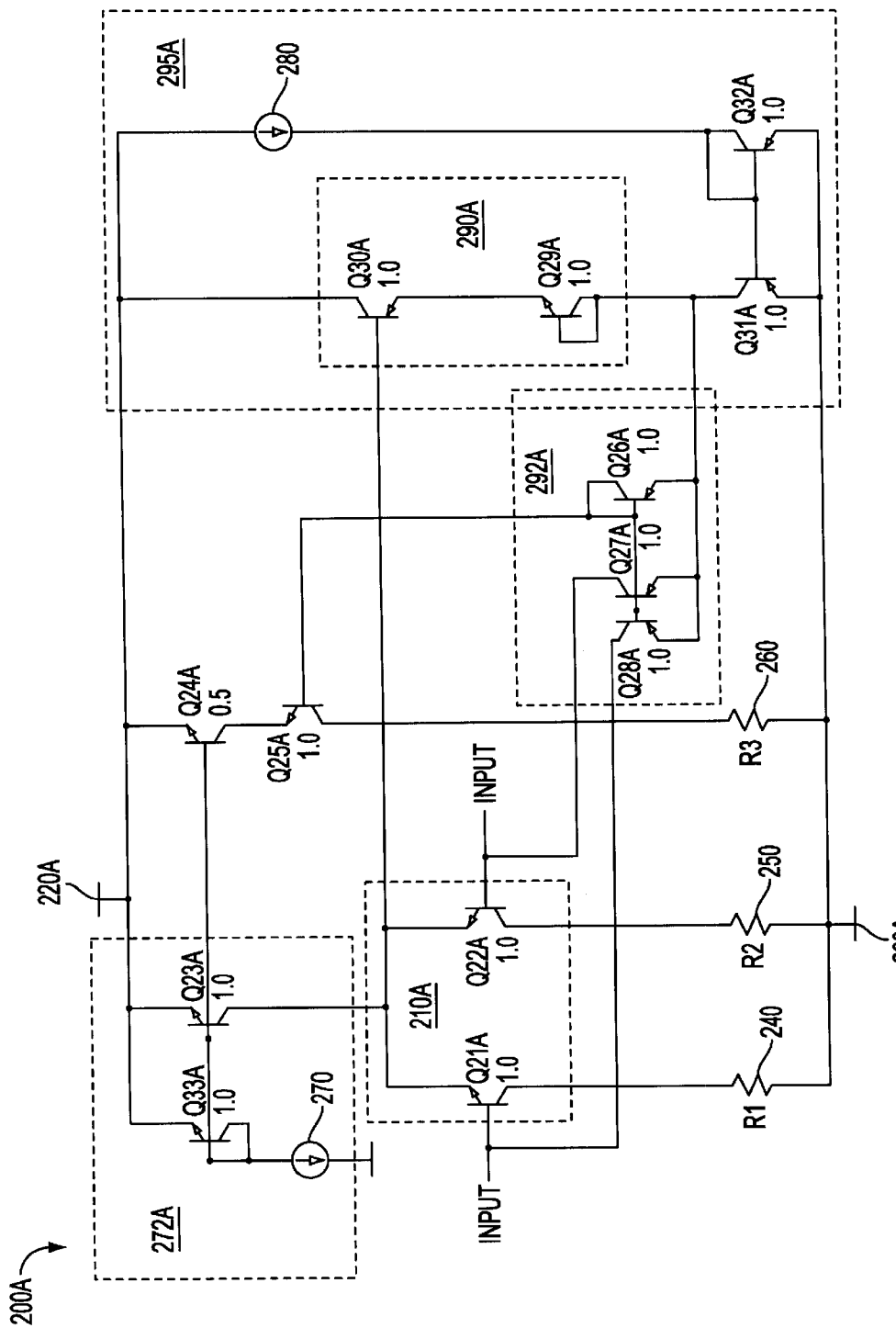
FIG. 3 schematically illustrates another embodiment of an arrangement of the present invention for canceling the input bias currents of a bipolar transistor differential pair having a NPN input stage.

FIG. 3 schematically illustrates an embodiment of the arrangement 200A of the present invention for canceling the input bias currents of a bipolar transistor differential pair having a NPN input stage 210A over most of the common-mode input voltage range. In this arrangement 200A, the NPN transistors Q21A and Q22A replace the PNP transistors Q21 and Q22 of the arrangement 200 shown in FIG. 2, respectively, as the input stage 210A of the differential amplifier.

Also in this arrangement 200A, the NPN transistors Q23A, Q24A, Q25A, Q29A and Q33A replace the PNP transistors Q23, Q24, Q25, Q29 and Q33 of the arrangement 200 shown in FIG. 2. Also, the PNP transistors Q26A, Q27A, Q28A, Q30A, Q31A and Q32A replace the NPN transistors Q26, Q27, Q28, Q30, Q31 and Q32 shown in FIG. 2. The transistors Q26A, Q29A, Q32A and Q33A are diode-connected transistors.

The supply rail 220A includes a negative supply rail and the supply rail 230A includes a positive supply rail. The transistor Q23A, the diode-connected transistor Q33A and the current source IS1 270 form the tail current circuit 272A because they set up the tail current of the transistors Q21A and Q22A. The transistors Q29A, Q30A, Q31A, and Q32A and the current source is IS2 280 form the bootstrap circuit 295A. The transistors Q29A and Q30A form the bootstrap loop 290A and the transistors Q26A and Q27A and Q28A form the current mirror 292A.

A voltage analysis of this embodiment of the arrangement 200 provides that the input bias current can be cancelled over a common-mode input voltage range of voltages within at least within 0.2 VDC of the positive supply rail 220A voltage.

Those of ordinary skill in the art will recognize that the above arrangements 200 and 200A discussed with references to FIGS. 2 and 3 are applicable to both unbalanced and balanced-output differential amplifiers. Those of ordinary skill will appreciate that the arrangements 200 and 200A can operate in parallel, e.g., in the same integrated circuit (IC) chip. Those of ordinary skill will also appreciate that the embodiments and examples discussed above are for illustration purposes and that modifications can be made to the arrangements 200 and 200A without deviating from the scope and essence of the present invention.

What is claimed is:

1. A circuit (200) to cancel an input bias current of a differential amplifier, the circuit (200) comprising:
   an input stage of the differential amplifier including first and second PNP transistors (Q21 and Q22), the collector of the first PNP transistor (Q21) coupled to a first electronic load (240), the collector of the second PNP transistor (Q22) coupled to a second electronic load (250), and the first and second electronic loads (240 and 250) coupled to a negative supply rail (230);
   a tail current circuit (272) coupled to a positive supply rail (220) and the emitters of the first and second PNP transistors (Q21 and Q22);

a compensating current circuit (Q24) coupled to the tail current circuit (272) and the positive supply rail (220);

a third PNP transistor (Q25), the emitter of the third PNP transistor (Q25) coupled to the compensating current circuit (Q24), and the collector of the third PNP transistor (Q25) coupled to the negative supply rail (230);

a first diode-connected NPN transistor (Q26), the collector of the first diode-connected NPN transistor (Q26) coupled to the base of the third PNP transistor (Q25);

a first NPN transistor (Q27), the base of the first NPN transistor (Q27) coupled to the base of the first diode-connected NPN transistor (Q26), the emitter of the first NPN transistor (Q27) coupled to the emitter of the first diode-connected NPN transistor (Q26), and the collector of the first NPN transistor (Q27) coupled to the base of the second PNP transistor (Q22);

a second NPN transistor (Q28), the bases of the second and first NPN transistors (Q28 and Q27) coupled to each other, the collector of the second NPN transistor (Q28) coupled to the base of the first PNP transistor (Q21), and the emitters of the second and first NPN transistors (Q28 and Q27) coupled to each other; and a bootstrap circuit (295) coupled to the emitters of the first and second PNP transistors (Q21 and Q22), the tail current circuit (272), the emitters of the first and second NPN transistors (Q27 and Q28) and the emitter of the first diode-connected NPN transistor (Q26);

wherein the tail current circuit (272) generates a tail current for the first and second PNP transistors (Q21 and Q22);

wherein the compensating current circuit (Q24) supplies a current such that the third PNP transistor (Q25) has a base current proportional to the input bias current;

wherein the third PNP transistor (Q25) supplies the first diode-connected NPN transistor (Q26) with an input bias cancellation current;

wherein the first and second NPN transistors (Q27 and Q28) supply the bases of the second and first PNP transistors (Q22 and Q21) with the input bias cancellation current respectively;

wherein the bootstrap circuit (295) senses the emitters of the first and second PNP transistors (Q21 and Q22) and provides a bias to the first diode-connected NPN transistor (Q26); and wherein the circuit (200) can cancel the input bias current for common-mode voltages ranging up to within 0.2 direct current voltage (VDC) of the negative supply rail (230) voltage.

2. The circuit (200) of claim 1, wherein the tail current circuit (272) includes a fourth PNP transistor (Q23), a second diode-connected PNP transistor (Q33), and a first current source 270; and the bases of the fourth PNP transistor (Q23) and the second diode-connected PNP transistor (Q33) coupled to each other, the emitters of the fourth PNP transistor (Q23) and the second diode-connected PNP transistor (Q33) coupled to the positive supply rail (220), the collector of the second diode-connected PNP transistor (Q33) coupled to the first current source (270) coupled to the negative supply rail (230), and the collector of the fourth PNP transistor (Q23) coupled to the emitters of the first and second PNP transistors (Q21 and Q22).

3. The circuit (200) of claim 1, wherein the values of the first and second electronic loads (240 and 250) are the same to allow the collectors of the first and second PNP transistors (Q21 and Q22) to be at the same voltage.

4. The circuit (200) of claim 1, wherein the bootstrap circuit (295) includes third and fourth NPN transistors (Q30 and Q31), a first diode-connected PNP transistor (Q29), a second diode-connected NPN transistor (Q32) and a second current source (280);

the emitters of the fourth NPN transistor (Q31) and the second diode-connected NPN transistor (Q32) coupled to the negative supply rail (230), the collector of the second diode-connected NPN transistor (Q32) coupled to the second current source (280) coupled to the positive supply rail (220), the bases of the fourth NPN transistor (Q31) and the second diode-connected NPN transistor (Q32) coupled to each other, the collector of the fourth NPN transistor (Q31) coupled to the collector of the first diode-connected PNP transistor (Q29), the emitters of the first diode-connected PNP transistor (Q29) and the third NPN transistor (Q30) coupled to each other, and the collector of the third NPN transistor (Q30) coupled to the positive supply rail (220); and wherein the base of the third NPN transistor (Q30) is coupled to the emitters of the first and second PNP transistors (Q21 and Q22) and the tail current circuit (Q23), and the collector of the first diode-connected PNP transistor (Q29) coupled to the emitters of the first and second NPN transistors (Q27 and Q28) and the emitter of the first diode-connected NPN transistor (Q26).

5. A circuit (200A) to cancel an input bias current of a differential amplifier, the circuit (200A) comprising:

an input stage of the differential amplifier including first and second NPN transistors (Q21A and Q22A), the collector of the first NPN transistor (Q21A) coupled to a first electronic load (240), the collector of the second NPN transistor (Q22A) coupled to a second electronic load (250), and the first and second electronic loads (240 and 250) coupled to a positive supply rail (230A);

a tail current circuit (272A) coupled to a negative supply rail (220A) and the emitters of the first and second NPN transistors (Q21A and Q22A);

a compensating current circuit (Q24A) coupled to the tail current circuit (272A) and the negative supply rail (220A);

a third NPN transistor (Q25A), the emitter of the third NPN transistor (Q25A) coupled to the compensating current circuit, and the collector of the third NPN transistor (Q25A) coupled to the positive supply rail (230A);

a first diode-connected PNP transistor (Q26A), the collector of the first diode-connected PNP transistor (Q26A) coupled to the base of the third NPN transistor (Q25A);

a first PNP transistor (Q27A), the base of the first PNP transistor (Q27A) coupled to the base of the first diode-connected PNP transistor (Q26A), the emitter of the first PNP transistor (Q27A) coupled to the emitter of the first diode-connected PNP transistor (Q26A), and the collector of the first PNP transistor (Q27A) coupled to the base of the second NPN transistor (Q22A);

a second PNP transistor (Q28A), the bases of the second and first PNP transistors (Q28A and Q27A) coupled to each other, the collector of the second PNP transistor (Q28A) coupled to the base of the first NPN transistor (Q21A), and the emitters of the second and first PNP transistors (Q28A and Q27A) coupled to each other;

a bootstrap circuit (295A) coupled to the emitters of the first and second NPN transistors (Q21A and Q22A), the tail current circuit (272A), the emitters of the first and second PNP transistors (Q27A and Q28A) and the emitter of the first diode-connected PNP transistor (Q26A);

wherein the tail current circuit (272A) generates a tail current for the first and second NPN transistors (Q21A and Q22A);

wherein the compensating current (Q24A) circuit supplies a current such that the third NPN transistor (Q25A) has a base current proportional to the input bias current;

wherein the third NPN transistor (Q25A) supplies the first diode-connected PNP transistor (Q26A) with an input bias cancellation current;

wherein the first and second PNP transistors (Q27A and Q28A) supply the bases of the second and first NPN transistors (Q22A and Q21A) with the input bias cancellation current respectively;

wherein the bootstrap circuit (295A) senses the emitters of the first and second NPN transistors (Q21A and Q22A) and provides a bias to the first diode-connected PNP transistor (Q26A); and wherein the circuit (200A) can cancel the input bias current for common-mode voltages ranging up to within 0.2 direct current voltage (VDC) of the positive supply rail (230A) voltage.

6. The circuit (200A) of claim 5, wherein the tail current circuit (272A) includes a fourth NPN transistor (Q23A), a second diode-connected NPN transistor (Q33A), and a current source (270A); and the bases of the fourth NPN transistor (Q23A) and the second diode-connected NPN transistor (Q33A) coupled to each other, the emitters of the fourth NPN transistor (Q23A) and the second diode-connected NPN transistor (Q33A) coupled to the negative supply rail (220A), the collector of the second diode-connected NPN transistor (Q33A) coupled to the current source (270A) coupled to the positive supply rail (230A), and the collector of the fourth NPN transistor (Q23A) coupled to the emitters of the first and second NPN transistors (Q21A and Q22A).

7. The circuit (200A) of claim 5, wherein the values of the first and second electronic loads (240 and 250) are the same to allow the collectors of the first and second NPN transistors (Q21A and Q22A) to be at the same voltage.

8. The circuit (200A) of claim 5, wherein the differential amplifier includes a rail-to-rail input output differential amplifier.

9. The circuit (200A) of claim 5, wherein the bootstrap circuit (295A) includes third and fourth PNP transistors (Q30A and Q31A), a first diode-connected NPN transistor (Q29A), a second diode-connected PNP transistor (Q32A), and the second current source (Q280);

the emitters of the fourth PNP transistor (Q31A) and the second diode-connected PNP transistor (Q32A) coupled to the positive supply rail (230A), the collector of the second diode-connected PNP transistor (Q32A) coupled to the second current source (280) coupled to the negative supply rail (220A), the bases of the fourth PNP transistor (Q31A) and the second diode-connected PNP transistor (Q32A) coupled to each other, the collector of the fourth PNP (Q31A) transistor coupled to the collector of the first diode-connected NPN transistor (Q29A), the emitters of the first diode-connected NPN transistor (Q29A) and the third PNP transistor (Q30A) coupled to each other, and the collector of the third PNP transistor (Q30A) coupled to the negative supply rail (220A); and wherein the base of the third PNP transistor (Q30A) is coupled to the emitters of the first and second NPN transistors (Q21A and Q22A) and the tail current circuit (272A), and the collector of the first diode-connected NPN transistor (Q29A) coupled to the emitters of the first and second PNP transistors (Q27A and Q28A) and the emitter of the first diode-connected PNP transistor (Q26A).

10. A circuit (200 or 200A) to cancel an input bias current of a differential amplifier, the circuit (200 or 200A) comprising:

an input stage of the differential amplifier including first and second one conductivity type transistors (Q21 and Q22 or Q21A and Q22A), the collector of the first one conductivity type transistor (Q21 or Q21A) coupled to a first electronic load (240), the collector of the second one conductivity type transistor (Q22 or Q22A) coupled to a second electronic load 250, and the first and second electronic loads (240 and 250) coupled to a first supply rail (230 or 230A);

a tail current circuit (272 or 272A) coupled to a second supply rail (220 or 220A) and the emitters of the first and second one conductivity type transistors (Q21 and Q22 or Q21A and Q22A);

a compensating current circuit (Q24 or Q24A) coupled to the tail current circuit (272 or 272A) and the second supply rail (220 or 220A);

a third one conductivity type transistor (Q25 or Q25A), the emitter of the third one conductivity type transistor (Q25 or Q25A) coupled to the compensating current circuit (Q24 or Q24A), and the collector of the third one conductivity type transistor (Q25 or Q25A) coupled to the first supply rail (230 or 230A);

a first diode-connected opposite conductivity type transistor (Q26 or Q26A), the collector of the first diode-connected opposite conductivity type transistor (Q26 or Q26A) coupled to the base of the third one conductivity type transistor (Q25 or Q25A);

a first opposite conductivity type transistor (Q27 or Q27A), the base of the first opposite conductivity type transistor (Q27 or Q27A) coupled to the base of the first diode-connected opposite conductivity type transistor (Q26 or Q26A), the emitter of the first opposite conductivity type transistor (Q27 or Q27A) coupled to the emitter of the first opposite conductivity type diode-connected transistor (Q26 or Q26A), and the collector of the first opposite conductivity type transistor (Q27 or Q27A) coupled to the base of the second one conductivity type transistor (Q22 or Q22A);

a second opposite conductivity type transistor (Q28 or Q28A), the bases of the second and first opposite conductivity type transistors (Q28 and Q27 or Q28A and Q27A) coupled to each other, the collector of the second opposite conductivity type transistor (Q28 or Q28A) coupled to the base of the first one conductivity type transistor (Q21 or Q21A), and the emitters of the second and first opposite conductivity type transistors (Q28 and Q27 or Q28A and Q27A) coupled to each other;

a bootstrap circuit (295 or 295A) coupled to the emitters of the first and second one conductivity type transistors (Q21 and Q22 or Q21A and Q22A), the tail current circuit (272 or 272A), the emitters of the first and second opposite conductivity type transistors (Q27 and Q28 or Q27A and Q28A) and the emitter of the first diode-connected opposite conductivity type transistor (Q26 or Q26A);

wherein the tail current circuit (272 or 272A) generates a tail current for the first and second conductivity type transistors (Q21 and Q22 or Q21A and Q22A);

wherein the compensating current circuit (Q24 or Q24A) supplies a current such that the third one conductivity type transistor (Q25 or Q25A) has a base current proportional to the input bias current;

wherein the third one conductivity type transistor (Q25 or Q25A) supplies the first diode-connected opposite conductivity type transistor (Q26 or Q26A) with an input bias cancellation current;

wherein the first and second opposite conductivity type transistors (Q27 and Q28 or Q27A and Q28A) supply the bases of the second and first one conductivity type transistors (Q22 and Q21 or Q22A and Q21A) with the input bias cancellation current respectively;

wherein the bootstrap circuit (295 and 295A) senses the emitters of the first and second one connectivity type transistors (Q21 and Q22 or Q21A and Q22A) and provides a bias to the first diode-connected opposite conductivity type transistor (Q26 or Q26A); and wherein the circuit (200 or 200A) can cancel the input bias current for common-mode voltages ranging up to within 0.2 direct current voltage (VDC) of the first supply rail (230 or 230A) voltage.

11. The circuit (200 or 200A) of claim 10, wherein the tail current circuit (272 or 272A) includes a fourth one conductivity type transistor (Q23 or Q23A), a second diode-connected one conductivity type transistor (Q33), and a first current source (270); and the bases of the fourth one conductivity type transistor (Q23 or Q23A) and the second diode-connected one conductivity type transistor (Q33 or Q33A) coupled to each other, the emitters of the fourth one conductivity type transistor (Q23 or Q23A) and the second diode-connected one conductivity type transistor (Q33 or Q33A) coupled to the second supply rail (220 or 220A), the collector of the second diode-connected one conductivity type transistor (Q33 or Q33A) coupled to the first current source (270) coupled to the first supply rail (230 or 230A), and the collector of the fourth one conductivity type transistor (Q23 or Q23A) coupled to the emitters of the first and second one conductivity type transistors (Q21 and Q22 or Q21A and Q22A).

12. The circuit (200 or 200A) of claim 10, wherein the bootstrap circuit (295 or 295A) includes third and fourth opposite conductivity type transistors (Q30 and Q31 or Q30A and Q31A), a first diode-connected one conductivity type transistor (Q29 or Q29A), a second diode-connected opposite conductivity type transistor (Q32 or Q33A) and a second current source (280);

the emitters of the fourth opposite conductivity type transistor (Q31 or Q31A) and the second diode-connected opposite conductivity type transistor coupled to the first supply rail (230 or 230A), the collector of the second diode-connected opposite conductivity transistor (Q32 or Q32A) coupled to the second current source (280) coupled to the second supply rail (220 or 220A), the bases of the fourth second conductivity type transistor (Q31 or Q31A) and the second diode-connected second conductivity type transistor (Q32 or Q32A) coupled to each other, the collector of the fourth opposite conductivity type transistor (Q31 or Q31A) coupled to the collector of the first diode-connected one conductivity type transistor (Q29 or Q29A), the emitters of the first diode-connected one conductivity type transistor (Q29 or Q29A) and the third opposite conductivity type transistor (Q30 or Q30A) coupled to each other, and the collector of the third opposite conductivity type transistor (Q30 or Q30A) coupled to the second supply rail (220 or 220A); and wherein the base of the third opposite conductivity type transistor (Q30 or Q30A) is coupled to the emitters of the first and second one conductivity type transistors (Q21 and Q22 or Q21A and Q22A) and the tail current circuit (Q23 or Q23A), and the collector of the first diode-connected one conductivity type transistor (Q29 or Q29A) coupled to the emitters of the first and second opposite conductivity type transistors (Q27 and Q28 or Q27A and Q28A) and the emitter of the first diode-connected opposite conductivity type transistor (Q26 or Q26A).

13. The circuit (200) of claim 10, wherein the one conductivity type transistor includes a PNP transistor.

14. The circuit (200) of claim 11, wherein the opposite conductivity type transistor includes a NPN transistor.

15. The circuit (200) of claim 12, wherein the first supply rail includes a negative supply rail.

16. The circuit (200) of claim 13, wherein the second supply rail includes a positive supply rail.

17. The circuit (200A) of claim 10, wherein the one conductivity type transistor includes a NPN transistor.

18. The circuit (200A) of claim 17, wherein the opposite conductivity type transistor includes a PNP transistor.

19. The circuit (200A) of claim 17, wherein the first supply rail includes a positive supply rail.

20. The circuit (200A) of claim 17, wherein the second supply rail includes a negative supply rail.

21. The circuit (200) of claim 1, wherein the differential amplifier includes a rail-to-rail input output differential amplifier.

* * * * *